United States Patent [19]

De Jager

[11] Patent Number: 4,961,046
[45] Date of Patent: Oct. 2, 1990

[54] VOLTAGE-TO-CURRENT CONVERTER

[75] Inventor: Willem De Jager, Enschede, Netherlands

[73] Assignee: U.S. Philips Corp., New York, N.Y.

[21] Appl. No.: 392,633

[22] Filed: Aug. 11, 1989

[30] Foreign Application Priority Data

Aug. 19, 1988 [NL] Netherlands .......................... 8802058

[51] Int. Cl.⁵ ................................................ G05F 3/20
[52] U.S. Cl. .................................... 323/315; 323/316; 307/261; 307/296.6
[58] Field of Search ....................... 323/312, 315, 316; 307/260, 261, 491, 296.1, 296.6, 296.8; 330/288

[56] References Cited

U.S. PATENT DOCUMENTS 4,412,186 10/1983 Nagano ............................... 323/316
4,528,496 7/1985 Naokawa et al. .................... 323/315
4,563,632 1/1986 Palara et al. ......................... 323/316
4,591,804 5/1986 van Tuijl ............................. 330/288
4,771,227 9/1988 Nelson ................................ 323/315
4,857,864 8/1989 Tanaka et al. ....................... 330/288

FOREIGN PATENT DOCUMENTS

WO86/04196 12/1985 PCT Int'l Appl. .

Primary Examiner—Peter S. Wong
Attorney, Agent, or Firm—Emmanuel J. Lobato

[57] ABSTRACT

By compensating for the base-emitter voltage of the transistor $T_1$ by means of the base-emitter voltage of the transistor $T_4$ the voltage $U_z$ across the impedance Z is made equal to the input voltage $U_i$. The current $I_z$ through the impedance Z and the equal output current $I_O$ are then proportional to the input voltage $U_i$ and are highly linear.

6 Claims, 3 Drawing Sheets

VOLTAGE-TO-CURRENT CONVERTER

BACKGROUND OF THE INVENTION

The invention relates to a voltage-to-current converter, comprising an input for receiving an input signal, an output for supplying an output signal, a first transistor of a first conductivity type, having its emitter coupled to a reference-voltage point via an impedance and having its collector coupled to the output via the base-emitter junction of a diode-connected second transistor, the emitter-base junction of a third transistor of a second conductivity type being arranged in parallel with the base-emitter junction of the second transistor, the collector of said third transistor being coupled to the base of the first transistor and also being coupled to the input via the emitter-base junction of a fourth transistor of the second conductivity type which has its collector coupled to the emitter of the first transistor.

Such a voltage-to-current converter is known from the international Patent Application No. WO 86/04196 and, in principle operates in the same way as the well-known emitter-follower arrangement if the current in the collector instead of the voltage on the emitter of the first transistor is taken as the output signal.

An emitter-follower arrangement has the drawback that the output current increases as a non-linear function of the input voltage, because the base-emitter voltage of the first transistor varies as the input voltage increases.

In the known-voltage-to-current converter the influence of the base-emitter voltage of the first transistor on the output signal is compensated for by coupling the base of the first transistor indirectly to the input via the base emitter junction of the fourth transistor, which is of a conductivity type opposite to that of the first transistor. Compensation is achieved by equalizing the base-emitter voltage of the first and the fourth transistor by means of the second and the third transistor which are arranged as a current mirror and which are of the same conductivity type as the fourth transistor. The current mirror maintains tha collector current of the first transistor equal to the emitter current of the fourth transistor, so that the base-emitter voltages of the first and the fourth transistor are approximately equal.

The compensation accuracy depends on the mirror ratio of the current mirror and the ratio between the saturation currents of the first and the fourth transistor. Since the first and the fourth transistor are of opposite conductivity types fixing the ratio between their saturation currents is comparatively problematic in practice. In practice the mirror ratio of the current mirror will also exihibit an inaccuracy owning to the spread in transistor parameters. As a result of this, the compensation of the base-emitter voltages of the first and the fourth transistor in the known voltage-to-current converter will be incomplete, which adversely offers the accuracy of the voltage-to-current conversion. It is an object of the invention to mitigate the above drawbacks of the known voltage-to-current converter and to improve the accuracy of the voltage-to-current conversion.

SUMMARY OF THE INVENTION

To this end a voltage-to-current converter of the type defined in the opening paragraph is characterized in that the second transistor is of the first conductivity type.

The second transistor is now of the same conductivity type as the first transistor. The third and the fourth transistor are both of the same conductivity type opposite to that of the first and the second transistor. Substantially the entire, emitter current of the first transistor flows through the diode connected second transistor and substantially the entire emitter current of the fourth transistor flows through the base-emitter junction of the third transistor. The base-emitter voltages of the first and the second transistor are consequently substantially equal and the same applies to the base-emitter voltages of the third and the fourth transistor. Since the base-emitter junctions of the second and the third transistor are arranged in parallel their base-emitter voltages will be equal to each other in spite of the fact that these transistors are of opposite conductivity types. As a result, all the base-emitter voltages of the first through the fourth transistor are substantially equal to one another. The ratio between the saturation currents of the first and the fourth transistor and the mirror ratio of the current mirror now have no influence.

By combining two voltage-to-current converters having one common impedance, a first embodiment of a voltage-to-current converter is obtained which, in accordance with the invention, is characterized in that the voltage-to-current converter forms part of a pair of identical voltage-to-current converters, the emitter of the first transistor of each of the converters of the pair consitituting the reference-voltage point for the impedance of the other converter of the pair. This embodiment is fully symmetrical and has two inputs and two outputs. The output currents are equal but oppositely directed and are proportional to the voltage difference on the two inputs. A combination of two voltage-to-current converters, of which one converter is complementary to the other, i.e. all the corresponding transistors are of opposite conductivity types, yields a second embodiment of a voltage-to-current converter which, in accordance with the invention, is characterized in that the voltage-to-current converter forms part of a pair of complementary voltage-to-current converters, the emitter of the first transistor of each of the converters of the pair constituting the reference-voltage point for the impedance of the other converter of the pair. This embodiment may be regarded as a "push-pull" version of the voltage-to-current converter. An advantage of this arrangement is that two output currents are available at two different potential levels without the use of a current mirror.

BRIEF DESCRIPTION OF THE DRAWING

Embodiments of the invention will now be described in more detail, by way of example, with reference to the accompanying drawings, in which.

DETAILED DESCRIPTION OF THE INVENTION

Figures 1A, 1B:
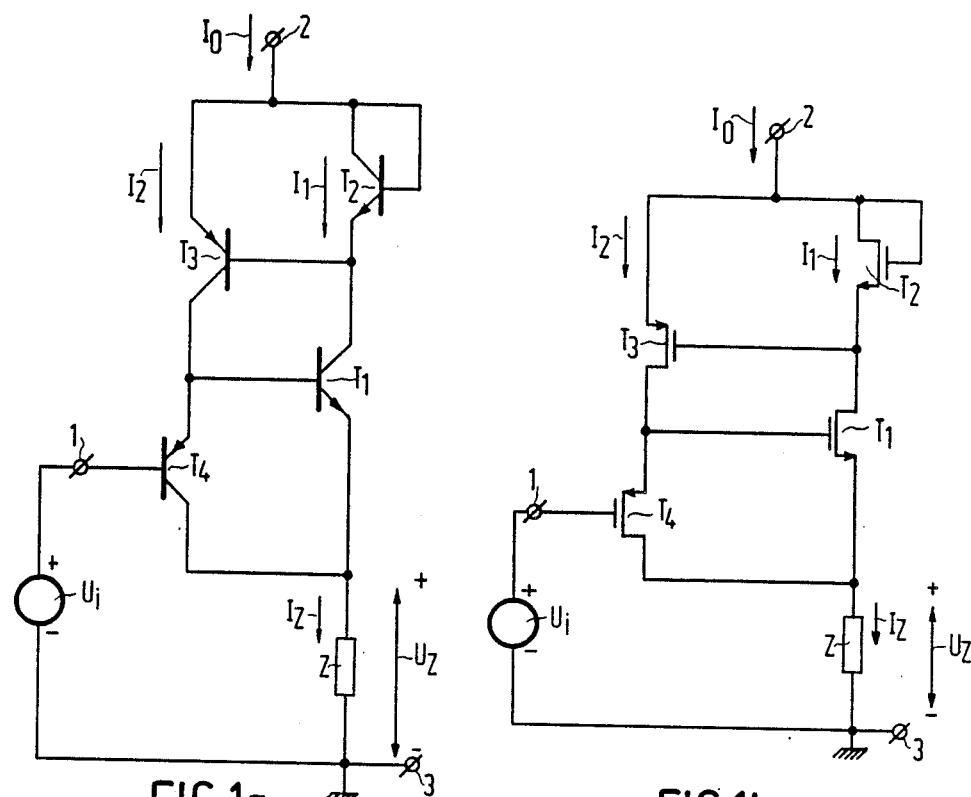
FIGS. 1a and 1b show two embodiments of the basic circuit of a voltage-to-current converter in accordance with the invention.

FIG. 1 shows two embodiments of the basic circuit of a voltage-to-current converter in accordance with the invention. FIG. 1a shows an arrangement comprising bipolar transistors and FIG. 1b shows an arrangement comprising unipolar transistors. The operation of both arrangements is identical. Hereinafter the invention will be described only for embodiments comprising bipolar transistors but the operation of the embodiments employing unipolar transistors can be understood by reading "gate", "source" and "drain" for "base", "emitter" and "collector" respectively. Between the output 2 and the collector of an NPN transistor $T_1$ a diode-connected NPN transistor $T_2$ is arranged. The base-emitter junction of a PNP transistor $T_3$ is arranged across said diode. The collector of the transistor $T_3$ is connected both to the base of the transistor $T_1$ and to the emitter of a PNP transistor $T_4$. The base of the transistor $T_4$ is connected to the input 1 of the voltage-to-current converter and the collector is connected to the emitter of the transistor $T_1$. The emitter of the transistor $T_1$ is connected to a reference-voltage point 3, in the present case earth, by an impedance Z. The circuit arrangement is powered by a power supply source, not shown, the output current $I_o$ flowing through a load, not shown. An input voltage $U_i$ is applied to the input 1 and the converter converts this voltage into an output current $I_o$ which is proportional to the input voltage and which is available on the output 2. The proportionality constant is dictated by the impedance Z. For the impedance a resistor is chosen, so that the proportionality constant is frequency independent. However, it is readily possible to replace the resistor by a frequency-dependent impedance which may include a bias current source. The output current $I_o$, which flows in the output 2 is equal to the current $I_z$ through the impedance Z if the base current of the transistor $T_4$ is ignored. This current $I_z$ is equal to the voltage $U_z$ across the impedance Z divided by the value of the impedance Z, so that: $I_o=I_z=U_z/Z$. If $U_z$ is made equal to the input voltage $U_i$ the voltage-to-current conversion will be ideal. The output current $I_o$ then follows the input voltage $U_i$: $I_o=U_i/Z$. If $Z=R$ this yields $I_o=U_i/R$, which is the ideal transfer function for a voltage-to-current converter. The voltage $U_z$ across the impedance Z is made equal to the input voltage $U_i$ in that the base-emitter voltage of the NPN transistor $T_1$ is compensated for by an equal but opposite emitter-base voltage of the PNP transistor $T_4$. This is achieved as follows. The current $I_o$ flowing in the output 2 is divided into a current $I_1$ through the NPN transistors $T_1$ and $T_2$ and a current $I_2$ through the PNP transistors $T_3$ and $T_4$. The base currents of $T_1$ and $T_3$ may be ignored. Since the current $I_1$ through the transistor $T_1$ also flows through the diode-connected but otherwise identical transistor $T_2$, the base-emitter voltage of the transistor $T_2$ will be equal to that of the transistor $T_1$. The current $I_2$ through the transistor $T_4$ also flows through the transistor $T_3$, which is identical to the transistor $T_4$. The base-emitter voltage of the transistor $T_4$ is consequently equal to that of the transistor $T_3$. Since the base-emitter junction of the transistor $T_3$ is arranged in parallel with that of the transistor $T_2$ the base-emitter voltage of the transistors $T_3$ and $T_2$ will be equal. It follows that the base-emitter voltage of the PNP transistor $T_4$ is equal to that of the NPN transistor $T_1$. The base-emitter voltage of the transistor $T_4$ thus accurately compensates for the base-emitter voltage of the transistor $T_1$ so that the voltage $U_z$ across the impedance Z is equal to the input voltage $U_i$.

This compensation method allows the input voltage $U_i$ to decrease to the voltage on the reference-voltage point 3 without the transistor $T_1$ being cut off. This is because the transistor $T_3$ ensures that the base current to the transistor $T_1$ is sustained. The smallest possible voltage drop across the transistors $T_1$, $T_2$ or $T_3$, $T_4$ is equal to one base-emitter voltage plus one collector emitter saturation voltage. Consequently, the emitter voltage may increase to approximately 1 V below the voltage on the output 2. Generally, the currents $I_1$ and $I_2$ will not be equal because the transistors $T_2$ and $T_3$ are of opposite conductivity types. However, for the compensation effect described in the foregoing the ratio between the currents $I_1$ and $I_2$ is not relevant.

Figure 2:
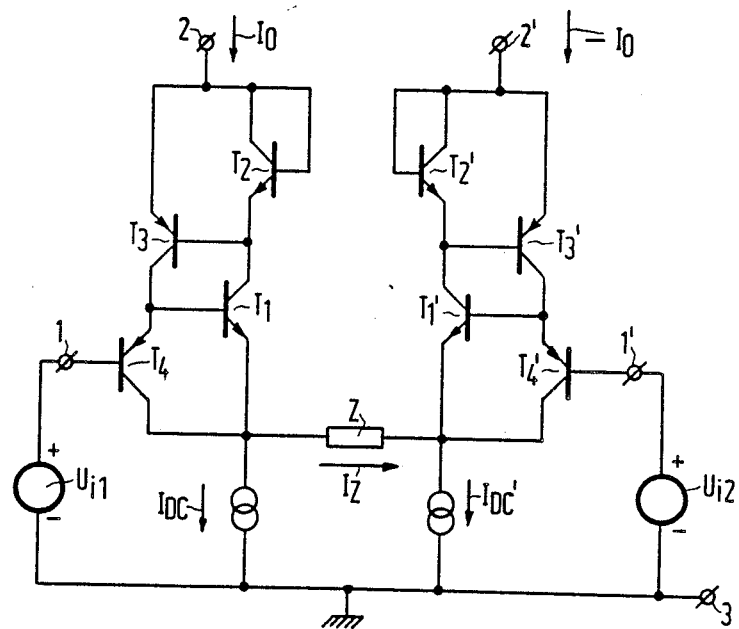
FIG. 2 shows a first embodiment of a voltage-to-current converter in accordance with the invention.

FIG. 2 shows a first embodiment of a voltage-to-current converter in accordance with the invention. It comprises a combination of two converters as shown in FIG. 1, having a common impedance Z. The references have the same meaning as in FIG. 1 and are primed for one of the two converters of the pair. The impedance Z, which is again shown as a resistor although this need not necessarily be so, is connected between the emitters of the transistors $T_1$ and $T_1'$. The two converters comprise a bias current source $I_{DC}$ and $I_{DC}$, between the emitters of the transistors $T_1$ and $T_1'$ and the reference-voltage point 3. The input voltages $U_{i1}$ and $U_{i2}$ are applied to the inputs 1 and 1'. The current $I_z$ through the impedance Z is proportional to the difference between the voltages $U_{i1}$ and $U_{i2}$: $I_z=(U_{i1}-U_{i2})/Z$. The current $I_z$ produces a signal current $+I_O$ in the output 2 and a signal current $-I_O$ in the output 2'. Consequently the output signal currents are equal but of opposite polarity. By making, for example, the signal voltage component in $U_{i2}$ zero, a voltage-to-current converter is obtained which converts one signal voltage into two equal but opposite signal currents.

Figure 3:
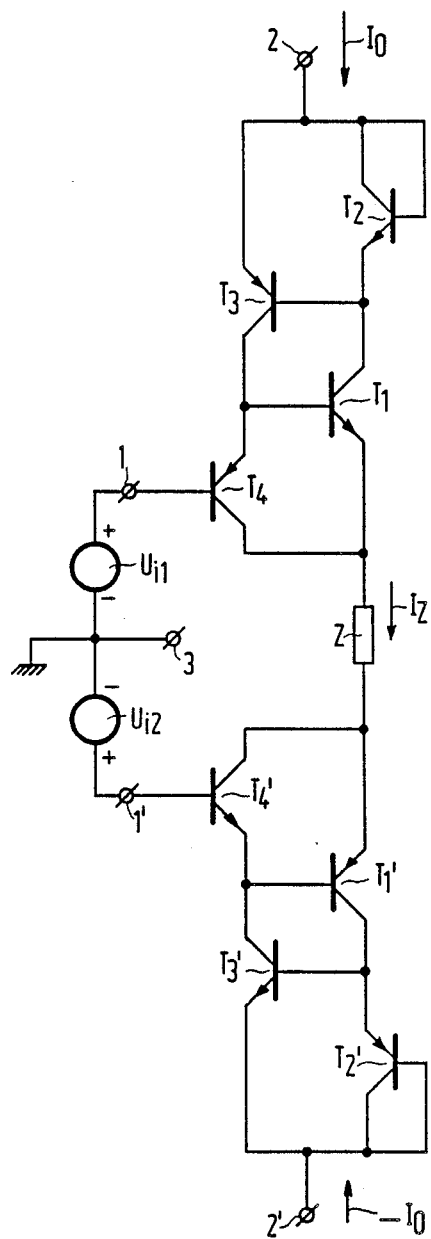
FIG. 3 shows a second embodiment of a voltage-to-current converter in accordance with the invention.
Figure 4A:
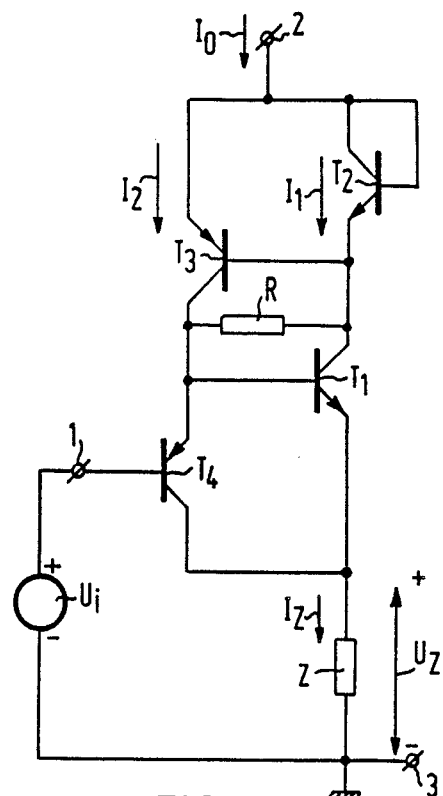
FIGS. 4a and 4b show embodiments of voltage-to-current converters comprsing a starting circuit in assordiance with the invention.
Figure 4B:
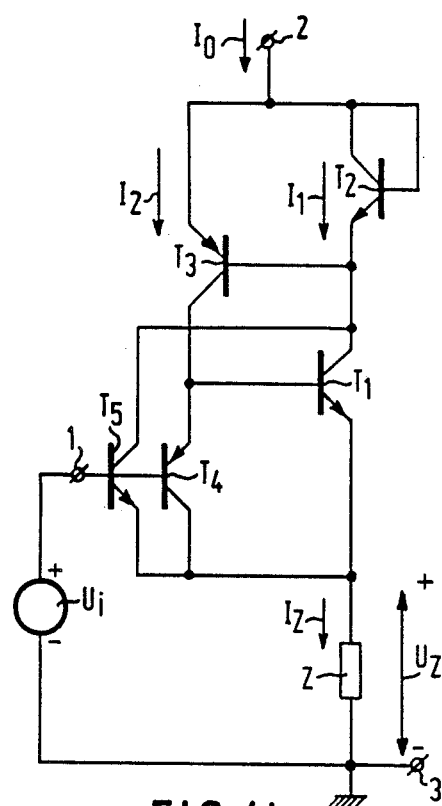

FIG. 3 shows a second embodiment of a voltage-to-current converter in accordance with the invention. It comprises two voltage-to-current converters as shown in FIG. 1, one converter being complementary to the other, i.e. all the corresponding transistors are of opposite conductivity types. The references in the Figure have the same meaning as in FIG. 2. A signal voltage $U_{i1}$ is applied to the input 1 and a signal voltage $U_{i2}$ is applied to the input 1'. A current $I_z$ proportional to the difference between the voltages $U_{i1}$ and $U_{i2}$ flows through the impedance Z. The current $I_z$ produces a current $+I_O$ in the output 2 and an equal but opposite current $-I_0$ in the output 2'. The outputs 2 and 2' are at different potentials in contradistinction to these in the configuration shown in FIG. 2. Below a specific input voltage $U_i$ the voltage-to-current converter shown in FIG. 1a may assume a currentless state and remain in this states despite a subsequently increasing input voltage if the collector-base currents of the transistors T1 and T3 are very small. In such rases it may be favourable to provide the voltage-to-current converter with a starting circuit, two embodiments of which are shown in FIG. 4. The circuits shown in FIG. 4 are indentical to those in FIG. 1a and corresponding parts bear the same reference numerals. In the embodiment shown in FIG. 4a the starting circuit comprises a resistor R between the collectors of the transistors T1 and T3. This starting circuit is already operative at very small input voltages. In the circuit shown in FIG. 4b the collector-emitter path of a transistor T5 of the same conductivity type as the transistor T1 is arranged in parallel with the collector-emitter path of the transistor T1. The base of the transistor T4 is connected to the input 1. This starting circuit operates form an input voltage U1 higher than the base emitter threshold voltage of the transistor T5. Obviously, the starting circuits can also be employed in the voltage-to-current converters shown in FIGS. 2 and 3.

The invention is not limited to the circuit arrangements shown. Bipolar transistors may be replaced by unipolar transistors and transistors of opposite conductivity type may be employed. Impedances allowing the passage of direct current may be arranged in series with the collectors of the transistors $T_1$ and $T_3$ the basic operation of the arrangement being influenced thereby.

I claim:

1. A voltage-to-current converter, comprising an input for receiving an input signal, an output for supplying an output signal, a first transistor of a first conductivity type, having its emitter coupled to a reference-voltage point through an impedance and having its collector coupled to the output through the base-emitter junction of a diode-connected second transistor, the emitter-base junction of a third transistor of a second conductivity type being arranged in parallel with the base-emitter junction of the second transistor, the collector of said third transistor being coupled to the base of the first transistor and also being coupled to the input through the emitter-base junction of a fourth transistor of the second conductivity type which has its collector coupled to the emitter of the first transistor, characterized in that the second transistor is of the first conductivity type.

2. A voltage-to-current converter as claimed in claim 1, characterized in that the collector of the first transistor is coupled to the collector of the third transistor through a resistor.

3. A voltage-to-current converter as claimed in claim 1, characterized in that a fifth transistor of the first conductivity type has its collector-emitter path arranged in parallel with the collector-emitter path of the first transistor and has its base coupled to the input.

4. A voltage-to-current converter as claimed in claim 1, characterized in that the voltage-to-current converter forms part of a pair of identical voltage-to-current converters, the emitter of the first transistor of each of the converters of the pair constituting the reference-voltage point for the impedance of the other converter of the pair.

5. A voltage-to-current converter as claimed in claim 1, characterized in that the voltage-to-current converters forms part of pair of complementary voltage-to-current converters, the emitters of the first transistor of each of the converters of the pair constituting the reference-voltage point for the impedance of the other converter of the pair.

6. A voltage-to-current converter as claimed in claim 1, in which the bipolar transistors are replaced by unipolar transistors.

* * * * *